(12) United States Patent
Trout

(10) Patent No.: US 8,747,124 B2
(45) Date of Patent: Jun. 10, 2014

(54) EYE-OF-THE NEEDLE PIN CONTACT

(71) Applicant: Tyco Electronics Corporation, Berwyn, PA (US)

(72) Inventor: David Allison Trout, Lancaster, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 29 days.

(21) Appl. No.: 13/647,143

(22) Filed: Oct. 8, 2012

(65) Prior Publication Data

US 2014/0099839 A1 Apr. 10, 2014

(51) Int. Cl.
*H01R 13/42* (2006.01)

(52) U.S. Cl.
USPC ............................................ 439/82; 439/751

(58) Field of Classification Search
USPC .................................................. 439/82, 751
See application file for complete search history.

(56) References Cited

U.S. PATENT DOCUMENTS

| | | | | |
|---|---|---|---|---|
| 4,606,589 A | * | 8/1986 | Elsbree et al. | 439/78 |
| 4,619,495 A | * | 10/1986 | Sochor | 439/637 |
| 5,564,954 A | * | 10/1996 | Wurster | 439/751 |
| 5,664,970 A | | 9/1997 | Millhimes et al. | |
| 6,077,128 A | | 6/2000 | Maag et al. | |
| 7,044,807 B2 | | 5/2006 | Furuno et al. | |
| 7,377,823 B2 | * | 5/2008 | Chen | 439/751 |
| 7,491,897 B2 | | 2/2009 | Watanabe et al. | |
| 7,670,196 B2 | * | 3/2010 | Fedder et al. | 439/751 |
| 7,922,545 B2 | * | 4/2011 | Saitoh | 439/751 |
| 8,092,262 B1 | | 1/2012 | Frederick et al. | |
| 8,142,236 B2 | | 3/2012 | Fedder et al. | |
| 2003/0049972 A1 | * | 3/2003 | Aoki | 439/751 |
| 2005/0221688 A1 | * | 10/2005 | Wolfel et al. | 439/751 |
| 2008/0182459 A1 | | 7/2008 | Fedder et al. | |
| 2008/0318453 A1 | * | 12/2008 | Dancison | 439/82 |

FOREIGN PATENT DOCUMENTS

DE 10229331 A1 1/2004

OTHER PUBLICATIONS

International Search Report in corresponding PCT Application No. PCT/US2013/060258 mailed on Nov. 27, 2013.

* cited by examiner

*Primary Examiner* — Gary Paumen

(57) ABSTRACT

An eye-of-the needle (EON) pin contact is provided for being received within an electrical via that includes conductive material. The EON pin contact includes a compliant segment having two opposing spring arms and an opening defined between the spring arms. The compliant segment is configured to be received within the electrical via such that the spring arms engage the conductive material of the electrical via. A tip segment extends from the compliant segment. The tip segment is configured to be received into the electrical via before the compliant segment is received into the electrical via. The tip segment includes a broach that is configured to displace the conductive material as the tip segment is received into the electrical via to plow a path through the conductive material for reception of a corresponding one of the spring arms.

20 Claims, 7 Drawing Sheets

EYE-OF-THE NEEDLE PIN CONTACT

BACKGROUND OF THE INVENTION

The subject matter described and/or illustrated herein relates generally to electrical contacts, and more particularly, to electrical contacts that include eye-of-the needle (EON) pins for mounting the electrical contact on a printed circuit.

Many printed circuits (sometimes referred to as "circuit boards" or "printed circuit boards") include electrical vias that receive EON pins for electrically connecting the printed circuit to another electrical device, for example an electrical connector, another printed circuit, an electrical cable, or an electrical power source. The EON pins include compliant segments having spring arms that resiliently deform as the EON pin is inserted into the electrical via. The compliant segment engages an electrically conductive material on the interior wall of the electrical via to establish an electrical connection between the electrical via and the EON pin.

As electronic systems become smaller, the signal paths thereof become more densely grouped. Moreover, there is a continual trend for electronic systems to operate at higher data rates. Also, there is a demand for reducing the size of the electrical vias within printed circuits to satisfy the increased density and/or higher data rates. For example, smaller electrical vias can be more densely grouped on the printed circuit. Moreover, and for example, smaller electrical vias may have better electrical performance (e.g., less interference with neighboring electrical vias) than larger electrical vias, which may enable the smaller electrical vias to carry a higher data rate.

As electrical vias within printed circuits are made smaller (e.g., diameters less than approximately 0.75 mm), the EON pins must also be reduced in size to fit into such smaller electrical vias. But, the spring arms of such smaller EON pins may have a reduced operating range, which may prevent the EON pin from establishing a reliable electrical connection with the electrical via. For example, at the low end of the tolerance range of the diameter of the electrical via, the electrical via may be too small for the compliant segment of the EON pin, such that the spring arms become overcompressed as the compliant segment is inserted into the electrical via. Such overcompression of the spring arms may reduce the resiliency thereof, and thereby inhibit the spring arms from adequately contacting the conductive material on the interior wall of the electrical via. To prevent such a reduction in the operating range of the spring arms, the allowable tolerances of the electrical via diameter may be reduced. But, reducing the allowable tolerances of the diameter of the electrical via may increase the cost of manufacturing printed circuits and/ or may reduce the number of printed circuits that can be manufactured within a given amount of time.

BRIEF DESCRIPTION OF THE INVENTION

In one embodiment, an eye-of-the needle (EON) pin contact is provided for being received within an electrical via that includes conductive material. The EON pin contact includes a compliant segment having two opposing spring arms and an opening defined between the spring arms. The compliant segment is configured to be received within the electrical via such that the spring arms engage the conductive material of the electrical via. A tip segment extends from the compliant segment. The tip segment is configured to be received into the electrical via before the compliant segment is received into the electrical via. The tip segment includes a broach that is configured to displace the conductive material as the tip segment is received into the electrical via to plow a path through the conductive material for reception of a corresponding one of the spring arms.

In another embodiment, a circuit board assembly includes a circuit board having an electrical via that includes conductive material, and an EON pin contact configured to be received within the electrical via. The EON pin contact includes a compliant segment having two opposing arms and an opening defined between the arms, and a tip segment that extends from the compliant segment. The tip segment is configured to be received into the electrical via before the compliant segment is received into the electrical via. The tip segment includes a protrusion that is configured to create an interference fit between the tip segment and the conductive material as the tip segment is received into the electrical via such that the protrusion displaces the conductive material and plows a path through the conductive material for reception of a corresponding one of the arms.

In another embodiment, an EON pin contact is provided for being received within an electrical via. The EON pin contact includes a body extending along a central longitudinal axis. The body includes a neck segment and a compliant segment that extends from the neck segment. The compliant segment includes two opposing spring arms and an opening defined between the spring arms. A tip segment extends from the compliant segment such that the compliant segment extends along the central longitudinal axis from the neck segment to the tip segment. The tip segment includes opposite front and rear walls and opposite side walls that extend between the front and rear walls. The tip segment further includes a protrusion that extends outward on one of the side walls in a non-parallel direction relative to the central longitudinal axis.

DETAILED DESCRIPTION OF THE INVENTION

Figure 1:
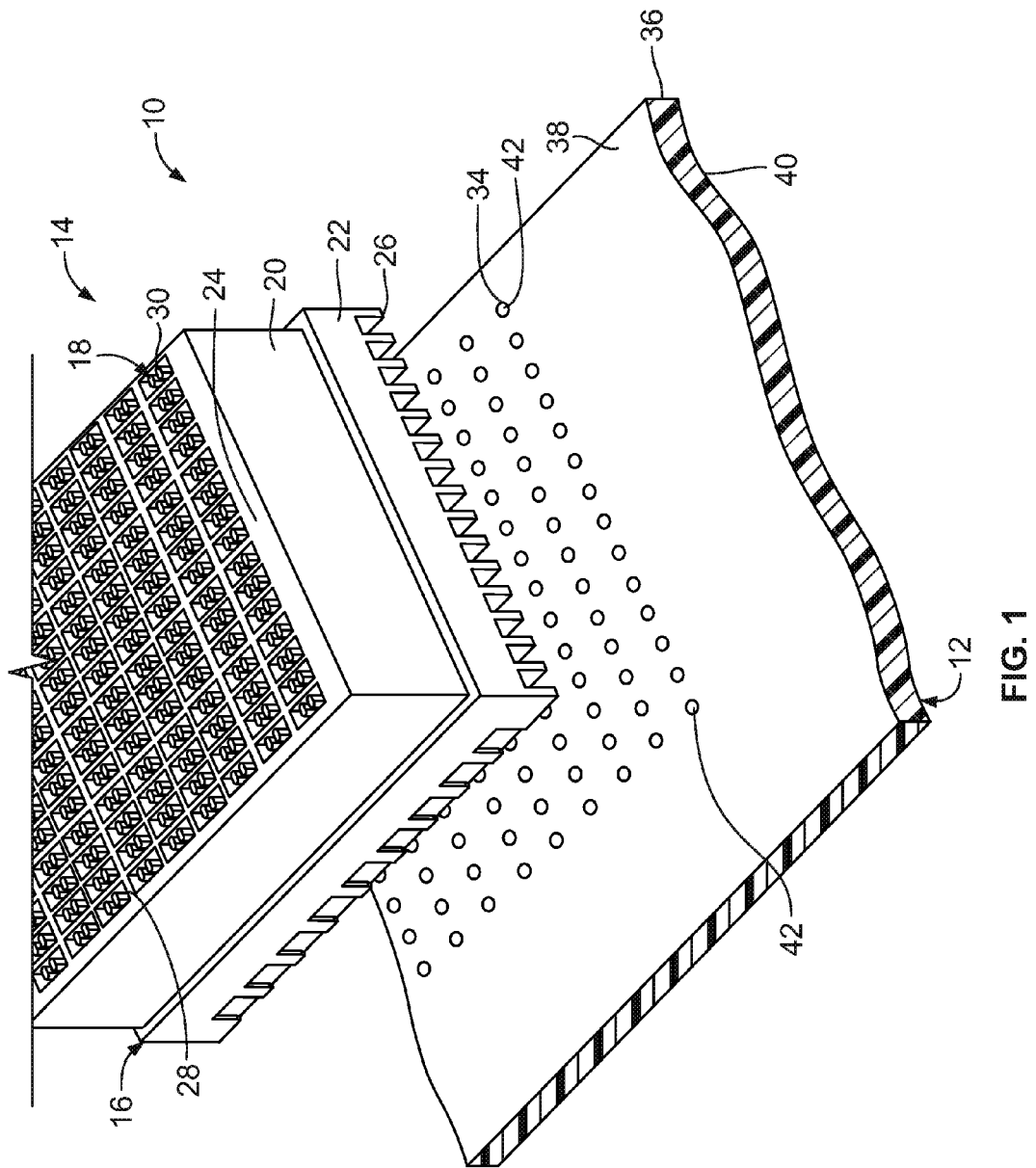
FIG. 1 is a partially exploded perspective view of an exemplary embodiment of an electrical connector and printed circuit assembly.

FIG. 1 is a partially exploded perspective view of an exemplary embodiment of an electrical connector and printed circuit assembly 10. The assembly 10 includes a printed circuit 12. In the exemplary embodiment, the assembly 10 also includes an electrical connector 14 that is configured to be mounted on the printed circuit 12 such that the electrical connector 14 is electrically connected to the printed circuit 12. The electrical connector 14 is used to electrically connect the printed circuit 12 to any other electrical device (not shown), such as, but not limited to, an electrical connector, another printed circuit, an electrical cable, an electrical power source, and/or the like. In some alternative embodiments, the assembly 10 does not include the electrical connector 14 and the printed circuit 12 mates directly with the other electrical device or with an electrical connector mounted on the other electrical device. In the exemplary embodiment, the electrical connector 14 mates with a complementary mating connector (not shown) mounted on the other electrical device to establish an electrical connection between the printed circuit 12 and the other electrical device. Alternatively, the electrical connector 14 mates directly with the other electrical device to electrically connect the printed circuit 12 to the other electrical device without the use of an intervening mating connector.

The electrical connector 14 includes a housing 16 that holds a plurality of electrical contacts 18. The housing 16 includes a mating segment 20 and a mounting segment 22. The mating segment 20 mates with the mating connector and includes a mating face 24, while the mounting segment 22 includes a mounting face 26. A plurality of ports 28 extend through the mating face 24 for exposing mating segments 30 of the electrical contacts 18. In the exemplary embodiment, the mating segments 30 of the electrical contacts 18 mate with mating contacts (not shown) of the mating connector to electrically connect the electrical connector 14 to the mating connector. The mating segment 20 of the housing 16 optionally defines a plug that is configured to be received within a receptacle (not shown) of the mating connector. In the exemplary embodiment, the mating and mounting faces 24 and 26, respectively, extend opposite, and thus approximately parallel, to each other. Alternatively, the mating and mounting faces 24 and 26, respectively, extend at any other angle relative to each other, such as an approximately perpendicular angle or an oblique angle. The electrical connector 14 may include any number of the electrical contacts 18.

Figure 2:
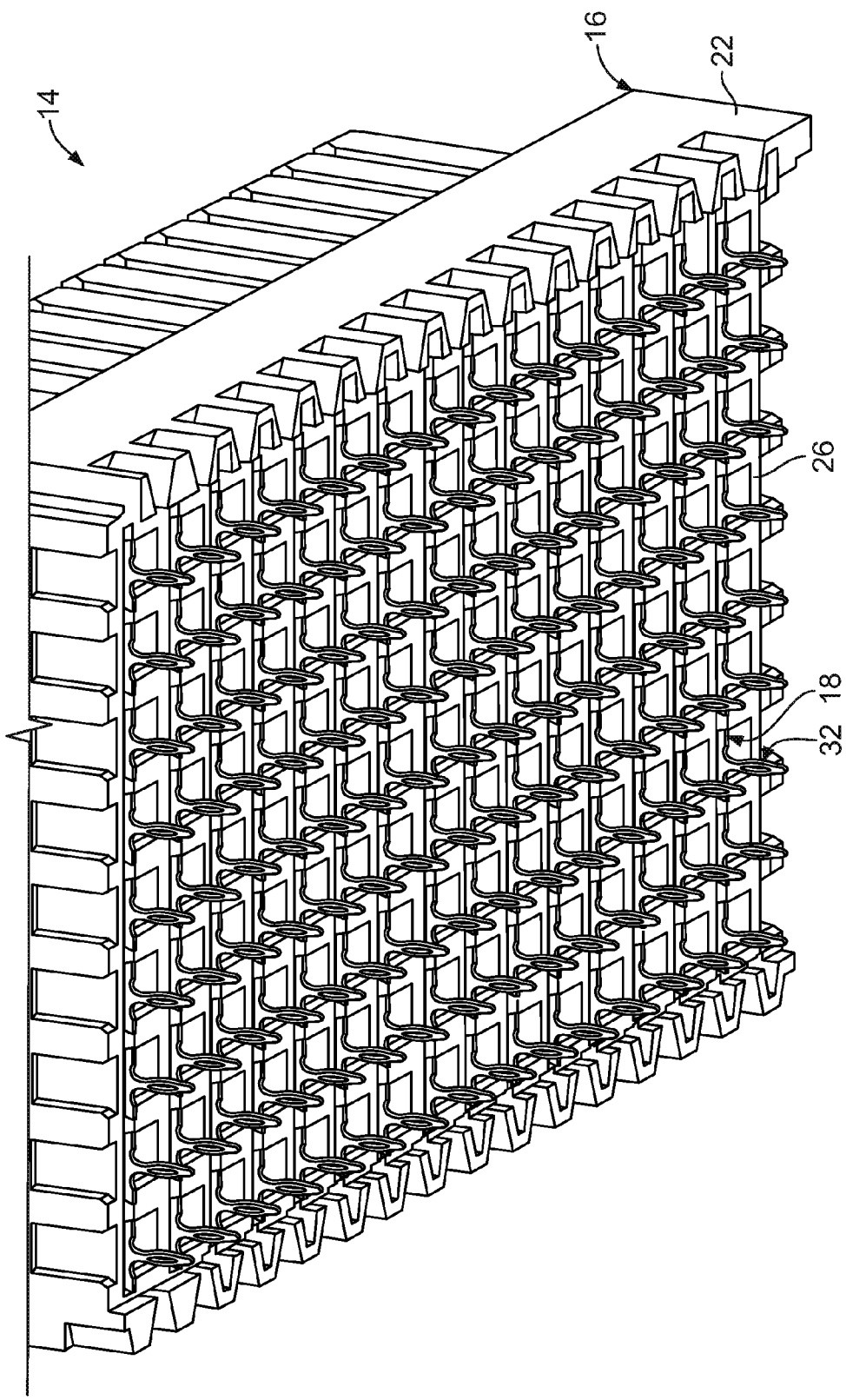
FIG. 2 is a perspective view of an exemplary embodiment of the electrical connector shown in FIG. 1.
Figure 6:
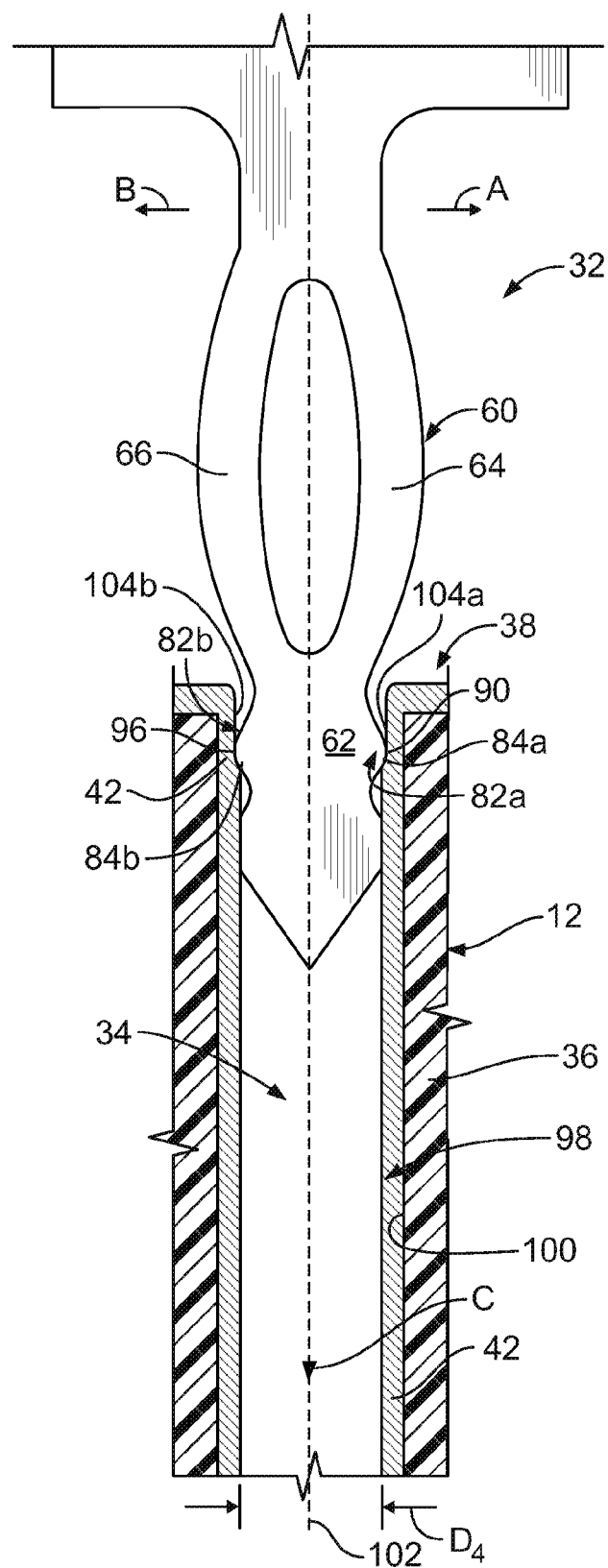
FIG. 6 is a cross-sectional view illustrating the EON pin shown in FIGS. 4 and 5 partially received into an exemplary electrical via.
Figure 7:
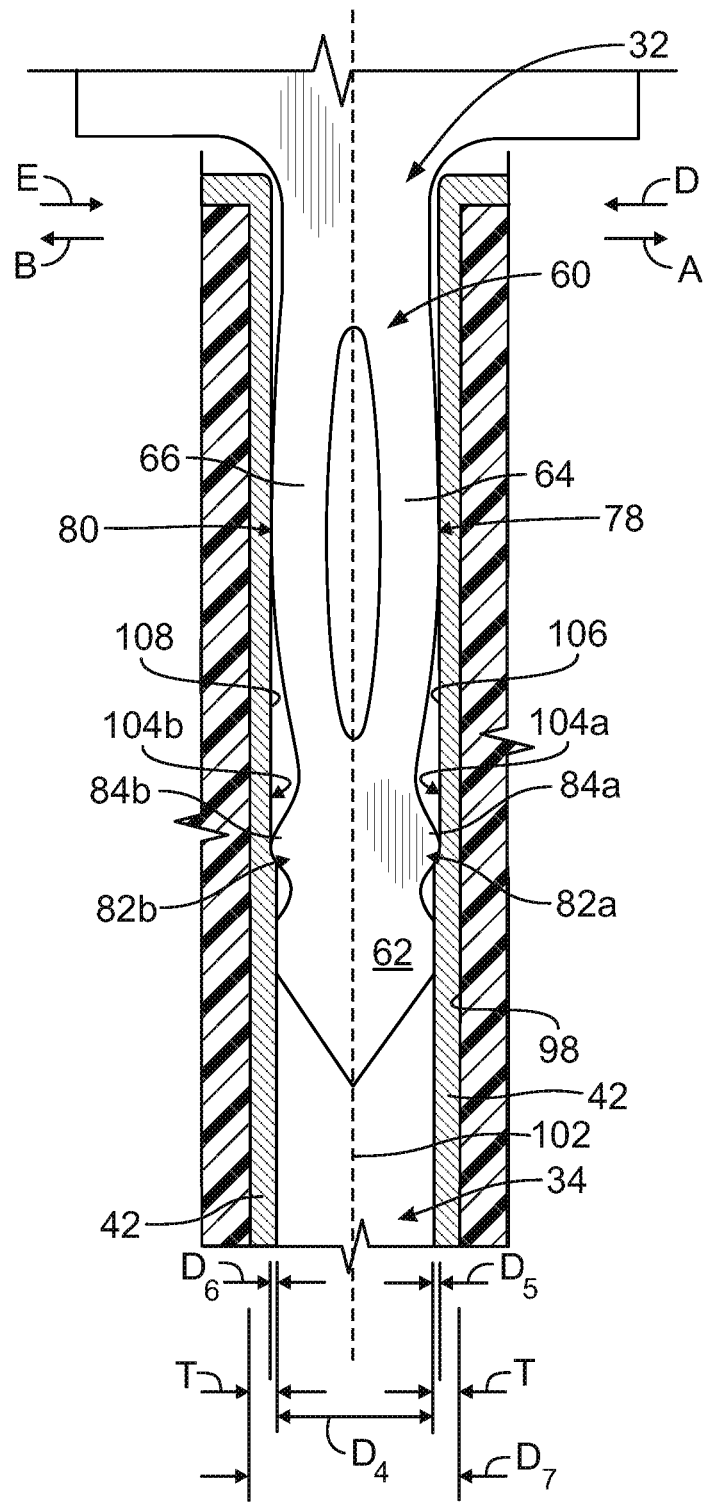
FIG. 7 is a cross-sectional view illustrating the EON pin shown in FIGS. 4-6 fully received within the electrical via shown in FIG. 6.

FIG. 2 is a perspective view of an exemplary embodiment of the electrical connector 14. FIG. 2 illustrates the mounting segment 22 and the mounting face 26 of the housing 16. The mounting segment 22 is configured to be mounted on the printed circuit 12 (FIGS. 1, 6, and 7). Optionally, the mounting face 26 engages the printed circuit 12 when the electrical connector 14 is fully mounted on the printed circuit 12. The electrical contacts 18 include eye-of-the needle (EON) pins 32 that extend outwardly along the mounting face 26 of the housing 16. When the electrical connector 14 is mounted on the printed circuit 12, the EON pins 32 are received within corresponding electrical vias 34 (FIGS. 1, 6, and 7) of the printed circuit 12 to electrically connect the electrical contacts 18 to the printed circuit 12.

The electrical contacts shown and/or described herein (e.g., the electrical contact 18) are components of the electrical connector 14. But, the electrical contacts shown and/or described herein may alternatively be components of the other electrical device that electrically connects to the printed circuit 12. Moreover, the EON pins shown and/or described herein (e.g., the EON pins 32, 132, 232, 332, and 432) are not limited to being used with the specific electrical connector 14 shown and described herein. Rather, the electrical connector 14 shown and described herein is meant as exemplary only. The EON pins shown and/or described herein may be used with any other type of electrical connector and may be used with electrical connectors having different geometries, configurations, and/or the like than the electrical connector 14.

Referring again to FIG. 1, the printed circuit 12 includes a substrate 36 having a pair of opposite sides 38 and 40. The electrical connector 14 mounts onto the side 38 of the substrate 36. The printed circuit 12 includes the electrical vias 34, which extend into the side 38 of the substrate 36. The electrical vias 34 are defined by openings 98 (FIGS. 6 and 7) within the substrate 36 that have interior walls 100 (FIGS. 6 and 7) that include an electrically conductive material 42 thereon, such that the electrical vias 34 are electrically conductive. The electrical vias 34 are optionally electrically connected to electrical circuits (not shown) of the printed circuit 12, electrical components (not shown) of the printed circuit 12, and/or the like. Each electrical via 34 receives the EON pin 32 (FIGS. 2-7) of a corresponding electrical contact 18 therein. The printed circuit 12 may include any number of the electrical vias 34 for receiving any number of EON pins 32 of the electrical connector 14. Each electrical via 34 may extend completely through the substrate 36 or may extend into the side 38 only partially through the substrate 36.

Figure 3:
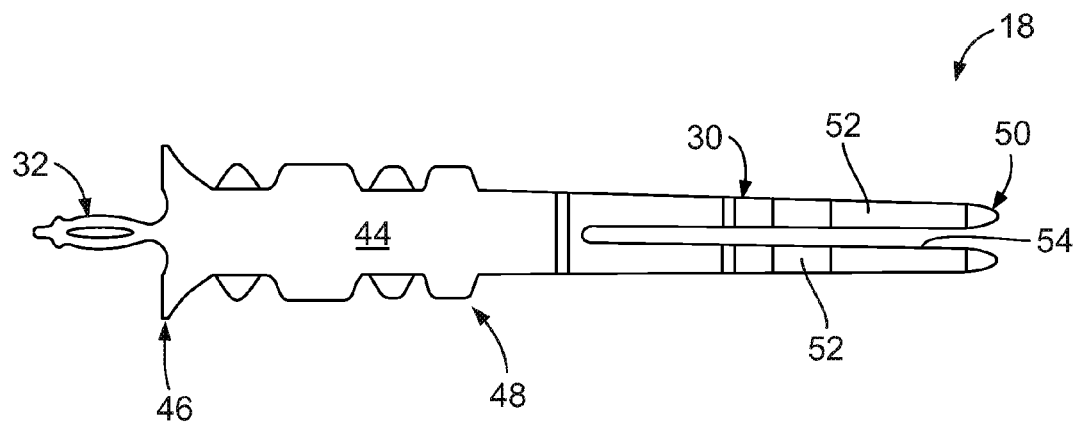
FIG. 3 is a plan view of an exemplary embodiment of an electrical contact of the electrical connector shown in FIGS. 1 and 2.

FIG. 3 is a plan view of an exemplary embodiment of one of the electrical contacts 18. The electrical contact 18 includes a base 44, the mating segment 30, and the EON pin 32. The base 44 extends a length from an end 46 to an opposite end 48. The EON pin 32 extends outwardly from the end 46 of the base 44. The mating segment 30 extends outwardly from the end 48 of the base 44.

The mating segment 30 extends outwardly from the base 44 to an end 50. When the base 44 is held within the housing 16, the mating segment 30 extends within the corresponding port 28 (FIG. 1) of the housing 16 for engagement with the corresponding mating contact of the mating connector. In the exemplary embodiment, the mating segment 30 includes a pair of resiliently deflectable fingers 52 that are spaced apart to define a mating slot 54 therebetween. The mating contact is inserted within the mating slot 54 of the mating segment 30 to mate the electrical contact 18 and the mating contact together. In addition or alternatively to the fingers 52, the mating segment 30 may include any other geometry, configuration, and/or the like for mating with the mating contact. For example, in some alternative embodiments, the mating segment 30 includes a pin (not shown) that is received within a receptacle (not shown) of the mating contact.

The EON pins shown and/or described herein (e.g., the EON pins 32, 132, 232, 332, and 432) are not limited to being used as a component of the electrical contacts 18. Rather, the remainder (besides the EON pin 32) of the electrical contact 18 shown and described herein is meant as exemplary only. The EON pins shown and/or described herein may be used as a component of any other type of electrical contact (whether such other type of electrical contact is a component of an electrical device or an intervening electrical connector) and may be used as a component of other electrical contacts having different base and mating segment geometries, configurations, and/or the like than the electrical contacts 18.

Figure 4:
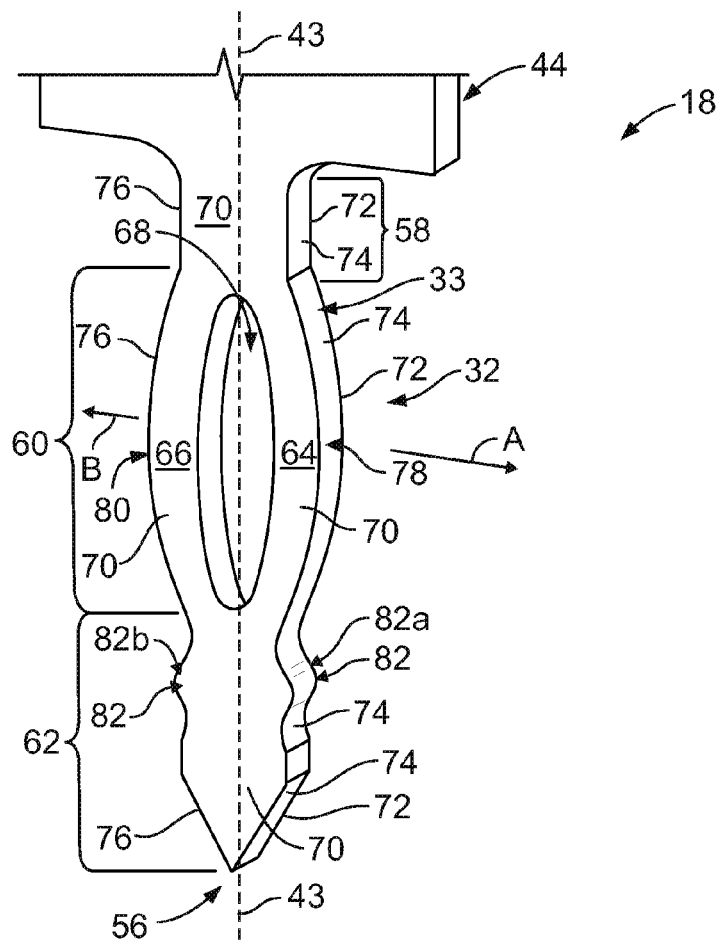
FIG. 4 is a perspective view of a portion of the electrical contact shown in FIG. 3 illustrating an exemplary embodiment of an eye-of-the needle (EON) pin of the electrical contact.

FIG. 4 is a perspective view of a portion of one of the electrical contacts 18 illustrating an exemplary embodiment of the EON pin 32 of the electrical contact 18. The EON pin 32 includes a body 33 that extends a length along a central longitudinal axis 43 from the base 44 to a tip 56. The EON pin 32 includes a neck segment 58, a compliant segment 60, and a tip segment 62. The neck segment 58 extends from the base 44. The compliant segment 60 extends from the neck segment 58, and the tip segment 62 extends from the compliant segment 60. In other words, the compliant segment 60 extends from the neck segment 58 to the tip segment 62. The tip segment 62 includes the tip 56. As should be apparent from at least FIGS. 2 and 4, the tip segment 62 of the EON pin 32 is configured to be received into the electrical via 34 (FIGS. 1, 6, and 7) before the compliant segment 60 is received into the electrical via 34.

The compliant segment 60 includes two opposing arms 64 and 66. The arms 64 and 66 are spaced apart to define an opening 68 therebetween. The compliant segment 60 is configured to be compressed as the compliant segment 60 is received into the electrical via 34 such that the arms 64 and 66 are moved toward each other. Specifically, the arms 64 and 66 are springs that are resiliently deflectable toward each other. As the EON pin 32 is received within the electrical via 34, the arms 64 and 66 engage the electrically conductive material 42 (FIGS. 1, 6, and 7) on the interior wall of the electrical via 34 and are deflected inwardly toward each other. The deflection of the arms 64 and 66 causes the arms 64 and 66 to exert spring forces in the directions A and B, respectively, against the electrically conductive material 42. Engagement between the arms 64 and 66 of the compliant segment 60 and the electrically conductive material 42 of the electrical via 34 electrically connects the EON pin 32 to the electrical via 34. The spring forces exerted by the arms 64 and 66 facilitate providing a sufficient amount of contact between the arms 64 and 66 and the electrically conductive material 42 such that a reliable electrical connection is formed between the EON pin 32 and the electrical via 34. The arms 64 and 66 may be referred to herein as "spring arms". Each of the arms 64 and 66 may be referred to herein as a "first" arm and/or a "second" arm.

Figure 5:
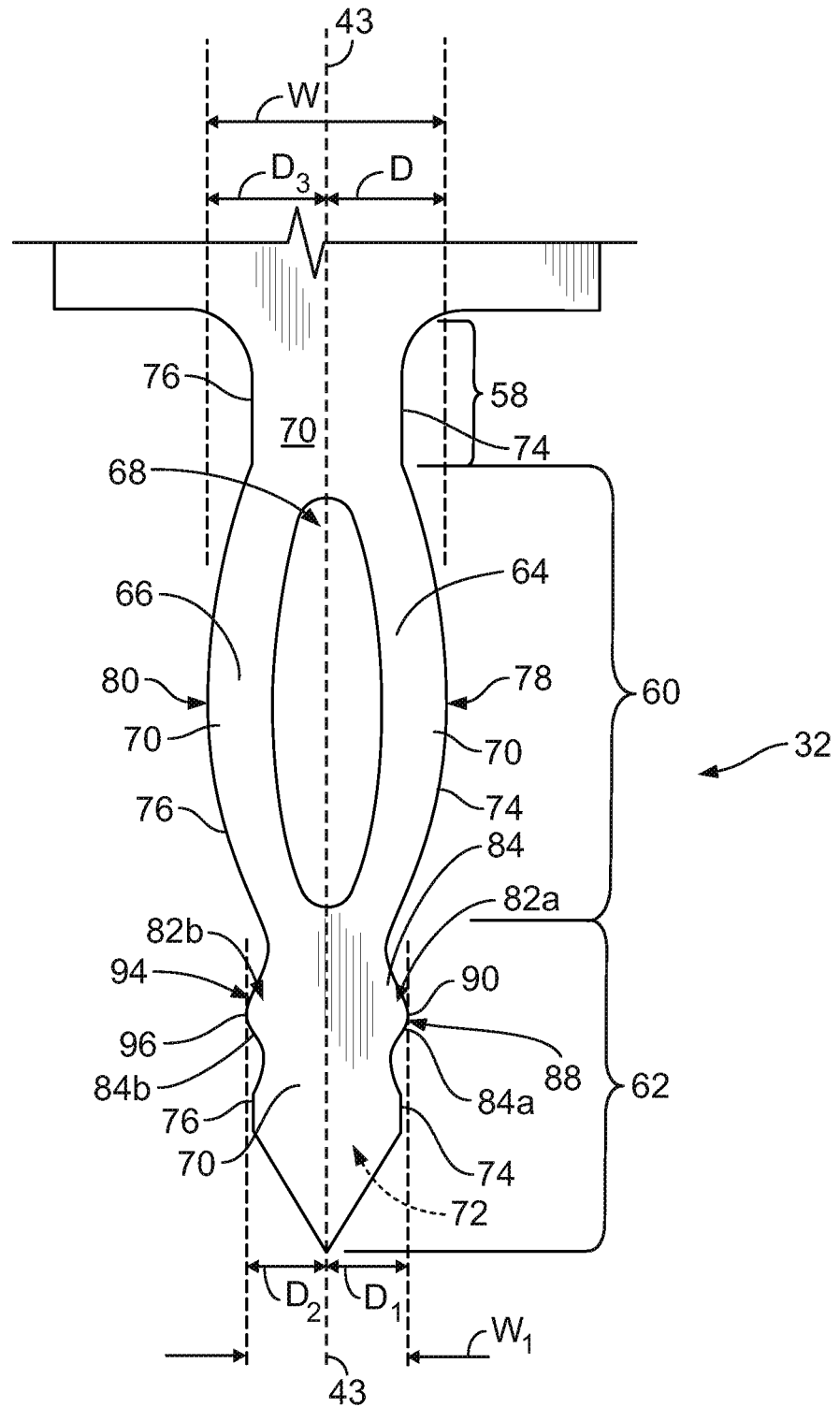
FIG. 5 is a plan view of the portion of the electrical contact shown in FIG. 4.

FIG. 5 is a plan view of the portion of the electrical contact 18 shown in FIG. 4. Referring now to FIGS. 4 and 5, the EON pin 32 includes a front wall 70 and a rear wall 72 that extends opposite the front wall 70. The EON pin 32 also includes side walls 74 and 76 that extend opposite each other. The side walls 74 and 76 extend between the front wall 70 and the rear wall 72. Each of the segments 58, 60, and 62 of the EON pin 32 includes, and is partially defined by, the front wall 70, the rear wall 72, and the side walls 74 and 76. Each of the side walls 74 and 76 may be referred to herein as a "first" and/or a "second" side wall.

FIGS. 4 and 5 illustrate the arms 64 and 66 of the EON pin 32 as undeflected. In other words, FIGS. 4 and 5 illustrate the compliant segment 60 of the EON pin 32 before the EON pin 32 has been inserted into the electrical via 34. The arms 64 and 66 include respective apexes 78 and 80 where the arms 64 and 66 engage the electrically conductive material 42 of the electrical via 34. Specifically, the side wall 74 includes the apex 78 and the side wall 76 includes the apex 80, such that the arms 64 and 66 are configured to engage the electrically conductive material 42 at the side walls 74 and 76. A width W of the compliant segment 60 when the compliant segment 60 is uncompressed (i.e., before being inserted into the electrical via 34) is defined between the apexes 78 and 80, as shown in FIG. 5.

In the exemplary embodiment, the front wall 70 and the rear wall 72 extend approximately parallel to each other, but the walls 70 and 72 may alternatively extend at an oblique angle relative to each other. The side walls 74 and 76 also extend approximately parallel to each other in the exemplary embodiment. Alternatively, the side walls 74 and 76 extend at an oblique angle relative to each other. Although the walls 70 and 72 extend approximately perpendicular to the side walls 74 and 76 in the exemplary embodiment, alternatively the wall 70 and/or the wall 72 extends at an oblique angle relative to the side wall 74 and/or the side wall 76.

The tip segment 62 of the EON pin 32 includes one or more broaches 82. As will be described in more detail below, each broach 82 is configured to displace the electrically conductive material 42 as the tip segment 62 is received into the electrical via 34 to plow a path through the electrically conductive material 42 for reception of a corresponding one of the arms 64 or 66. For example, each broach 82 may be have a size (e.g., the distance $D_1$ of the broach 82a shown in FIG. 5) that plows the path through the electrically conductive material 42 of the electrical via 34 when the diameter $D_4$ (shown in FIGS. 6 and 7) of the electrical via 34 is at a low end of the tolerance range of the diameter $D_4$. Moreover, and for example, each broach 82 may be sized such that the broach 82 does not plow the path through the electrically conductive material 42 of the electrical via 34 when the tolerance of the diameter $D_4$ is higher than the low end of the tolerance range.

In the exemplary embodiment, the tip segment 62 includes two broaches 82a and 82b. Specifically, the broach 82a extends outward on the side wall 74, while the broach 82b extends outward on the side wall 76. In other words, the side wall 74 includes the broach 82a, and the side wall 76 includes the broach 82b. The broach 82a is configured to plow a path through the electrically conductive material 42 for reception of the arm 64. The broach 82b is configured to plow a path through the electrically conductive material 42 for reception of the arm 66. Although two are shown, the tip segment 62 may include any number of broaches 82 for plowing any number of paths through the electrically conductive material 42. Moreover, each side wall 74 and 76 may include any number of broaches 82 for plowing any number of paths through the electrically conductive material 42. In some alternative embodiments, only one of the side walls 74 or 76 includes a broach 82.

Referring now solely to FIG. 5, each broach 82 is defined by a protrusion 84 that extends outward on the corresponding side wall 74 or 76. Specifically, the broach 82a is defined by a protrusion 84a that extends outward on the side wall 74, while the broach 82b is defined by a protrusion 84b that extends outward on the side wall 76. The protrusion 84a extends outward on the side wall 74 in a non-parallel direction relative to the central longitudinal axis 43 of the EON pin 32. Each of the protrusions 84a and 84b may be referred to herein as a "first" protrusion and/or a "second" protrusion.

The protrusion 84a extend outward on the side wall 74 to a broach tip 88, which includes an apex 90. The apex 90 of the protrusion 84a is configured to engage the electrically conductive material 42 to plow the path therethrough. As will be described in more detail below, the apex 90 is optionally configured to engage the electrically conductive material 42 with an interference fit to displace the electrically conductive material 42 and thereby plow the path. In the exemplary embodiment, and as can be seen in FIG. 5, the tip 88 of the protrusion 84a is rounded. The tip 88 may have a curve defined by any radius, which may be selected to facilitate plowing the path through the electrically conductive material 42. Moreover, in addition or alternatively to being rounded or curved, the tip 88 of the protrusion 84a may have other geometries, such as, but not limited to, a chamfer, a fillet, terminating at a point such that the tip 88 is pointed, and/or the like.

As can be seen in FIG. 5, when the compliant segment 60 is not compressed, the apex 90 of the protrusion 84a is spaced closer to the central longitudinal axis 43 than the apex 78 of the arm 64. Specifically, a distance D from the apex 78 of the arm 64 to the central longitudinal axis 43 is greater than a distance $D_1$ from the apex 90 of the broach 82a to the central longitudinal axis 43. The apex 90 may or may not be spaced closer to the central longitudinal axis 43 than the apex 78 when the compliant segment 60 is compressed within the electrical via 34.

Referring now to the broach 82b, the protrusion 84b extends outward on the sidewall 76 in a non-parallel direction relative to the central longitudinal axis 43 of the EON pin 32. The protrusion 84b extends outward to a broach tip 94. The broach tip 94 includes an apex 96, which is configured to engage the electrically conductive material 42 to plow the path therethrough. Optionally, the apex 96 is configured to engage the electrically conductive material 42 with an interference fit to displace the electrically conductive material 42 and thereby plow the path. In the exemplary embodiment, the tip 94 of the protrusion 84b is rounded. The tip 94 may have a curve defined by any radius, which may be selected to facilitate plowing the path through the electrically conductive material 42. In addition or alternatively to being rounded or curved, the tip 94 of the protrusion 84b may have other geometries, such as, but not limited to, a chamfer, a fillet, terminating at a point such that the tip 94 is pointed, and/or the like.

When the compliant segment 60 is not compressed, the apex 96 of the protrusion 84b is spaced closer to the central longitudinal axis 43 than the apex 80 of the arm 66. Specifically, a distance $D_2$ from the apex 96 of the broach 82b to the central longitudinal axis 43 is less than a distance $D_3$ from the apex 80 of the arm 66 to the central longitudinal axis 43. The apex 96 may or may not be spaced closer to the central longitudinal axis 43 than the apex 80 when the compliant segment 60 is compressed within the electrical via 34. A width $W_1$ of the tip segment 62 is defined between the apexes 90 and 96. As can be seen in FIG. 5, the width $W_1$ of the tip segment 62 is less than the width W of the compliant segment 60.

Although shown as having substantially similar geometries, alternatively the broaches 82a and 82b may have a different geometries relative to each other. For example, the protrusions 84a and 84b are not limited to having substantially the same size and/or shape as is shown herein. Rather, the protrusions 84a and 84b may have a different size and/or shape relative to each other.

FIG. 6 is a cross-sectional view illustrating insertion of the EON pin 32 within the electrical via 34. The electrical via 34 extends a depth into the substrate 36 along a central depth axis 102. The electrical via 34 includes a diameter $D_4$. The electrical via 34 includes the opening 98, which extends into the side 38 of the printed circuit 12. As described above, the opening 98 may also extend into the side 40 (FIG. 1) of the printed circuit 12 such that the opening 98 extends completely through the substrate 36 of the printed circuit 12, or the opening 98 may extend only partially through the substrate 36. The opening 98 is defined by the interior wall 100 of the substrate 36. The electrically conductive material 42 of the electrical via 34 is disposed on the interior wall 100. The electrically conductive material 42 may be any type of electrically conductive material and may be applied to the interior wall 100 using any process, means, and/or the like. For example, in some embodiments, the electrically conductive material 42 includes copper and is a plated material that is applied to the interior wall 100 using a plating process.

FIG. 6 illustrates the EON pin 32 partially received into the electrical via 34. The tip segment 62 is received into the electrical via 34 before the compliant segment 60. As shown in FIG. 6, the compliant segment 60 has not yet been received into the electrical via 34. As the tip segment 62 is inserted into the electrical via 34, the broaches 82a and 82b displace the electrically conductive material 42 and thereby plow respective paths 104a and 104b through the electrically conductive material 42 for reception of the arms 64 and 66, respectively. Each of the paths 104a and 104b may be referred to herein as a "first" path and/or a "second" path. Moreover, each of the paths 104a and 104b may be referred to herein as "another" path.

Plowing of the path 104a by the broach 82a will now be described in more detail. As the tip segment 62 of the EON pin 32 is received into the electrical via 34, the protrusion 84a of the broach 82a engages the electrically conductive material 42 and thereby displaces the material 42. In the exemplary embodiment, the protrusion 84a displaces the electrically conductive material 42 by creating an interference fit between the apex 90 of the protrusion 84a and the electrically conductive material 42. But, in addition or alternatively, other types of engagement between the protrusion 84a and the electrically conductive material 42 may be used to displace the electrically conductive material 42.

To plow the path 104a, the broach 82a may displace the electrically conductive material 42 radially outward (e.g., as indicated by the arrow A) with respect to the depth axis 102, for example by compressing the electrically conductive material 42 and/or by displacing other segments (i.e., segments that do not define the path 104a) radially inward and/or in along the depth axis 102. In addition or alternatively to displacing the electrically conductive material 42 radially outward, the broach 82a may plow the path 104a by displacing the electrically conductive material 42 in a direction C along the depth axis 102 and/or by cutting the path 104a through the electrically conductive material 42.

With respect to the path 104b plowed by the broach 82b, the protrusion 84b engages the electrically conductive material 42, and thereby displaces the material 42, as the tip segment 62 of the EON pin 32 is received into the electrical via 34. In the exemplary embodiment, the protrusion 84b displaces the electrically conductive material 42 by creating an interference fit between the apex 96 of the protrusion 84b and the electrically conductive material 42. Other types of engagement between the protrusion 84b and the electrically conductive material 42 may be used to displace the electrically conductive material 42 in addition or alternatively to the interference fit. To plow the path 104b, the broach 82b may displace the electrically conductive material 42 radially outward (e.g., as indicated by the arrow B) with respect to the depth axis 102, the broach 82b may displace the electrically conductive material 42 in the direction C along the depth axis 102, and/or the broach 82b may displace the electrically conductive material 42 by cutting the path 104a through the electrically conductive material 42.

FIG. 7 is a cross-sectional view illustrating the EON pin 32 fully received within the electrical via 34. The tip segment 62 is fully received into the electrical via 34 such that the broaches 82a and 82b have fully plowed the respective paths 104a and 104b. The paths 104a and 104b extend respective radial depths $D_5$ and $D_6$ to respective bottoms 106 and 108. As can be seen in FIG. 7, the depths $D_5$ and $D_6$ of the paths 104a and 104b, respectively, do not extend all the way through the thickness T of the electrically conductive material 42, such that the bottoms 106 and 108 of the respective paths 104a and 104b are defined by electrically conductive material 42 instead of the non-electrically conductive material of the substrate 36. The size of the protrusions 84a and/or 84b relative to the diameter $D_4$ of the electrical via 34 and/or a diameter $D_7$ of the opening 98 may be selected to ensure that the radial depths $D_5$ and $D_6$ of the paths 104a and 104b, respectively, do not extend completely through the thickness T of the electrically conductive material 42. In the exemplary embodiment, each of the paths 104a and 104b extends approximately parallel to the central depth axis 102 of the electrical via 34.

As the EON pin 32 is moved from the position shown in FIG. 6 to the position shown in FIG. 7, the arm 64 of the compliant segment 60 is received into, and travels along, the path 104a. As the arm 64 is received into the path 104a, the apex 78 of the arm 64 engages the electrically conductive material 42 at the bottom 106 of the path 104a. As the arm 64 travels along the path 104a, the engagement between the arm 64 and the bottom 106 of the path 104a deflects the arm 64 in the direction D, which enables the compliant segment 60 to be fully received into the electrical via 34. In the fully received position shown in FIG. 7, the arm 64 extends within the path 104a and the apex 78 of the arm 64 is engaged with the electrically conductive material 42 at the bottom 106 of the path 104a. The resilience of the arm 64 causes the arm 64 to exert a spring force in the direction A against the electrically conductive material 42 at the bottom 106 of the path 104a. The arm 64 of the EON pin 32 is thereby electrically connected to the electrical via 34.

With respect to the arm 66, the arm 66 of the compliant segment 60 is received into, and travels along, the path 104b as the EON pin 32 is moved from the position shown in FIG. 6 to the position shown in FIG. 7. The apex 80 of the arm 66 engages the electrically conductive material 42 at the bottom 108 of the path 104b as the arm 66 is received into the path 104b. As the arm 66 travels along the path 104b, the engagement between the arm 66 and the bottom 108 of the path 104b deflects the arm 66 in the direction E, which enables the compliant segment 60 to be fully received into the electrical via 34. In the fully received position shown in FIG. 7, the arm 66 extends within the path 104b and the apex 80 of the arm 66 is engaged with the electrically conductive material 42 at the bottom 108 of the path 104b. The arm 66 exerts a spring force in the direction B against the electrically conductive material 42 at the bottom 108 of the path 104b. The arm 66 of the EON pin 32 is thus electrically connected to the electrical via 34.

The paths 104a and 104b plowed by the tip segment 62 effectively provide the electrical via 34 with a greater diameter (than the diameter $D_4$) at the locations around the inner circumference of the electrical via 34 where the arms 64 and 66 engage the electrically conductive material 42. In other words, the paths 104a and 104b increase the width of the electrical via 34 between the locations where the arms 64 and 66 engage the electrically conductive material 42. The greater width at such locations may prevent overcompression of the compliant segment 60 of the EON pin 32. For example, such a greater width of the electrical via 34 may accommodate the uncompressed width W (FIG. 5) of the compliant segment 60 without compressing the arms 64 and 66 beyond the working range of the arms 64 and 66.

The paths 104a and 104b plowed by the tip segment 62 may therefore facilitate providing a reliable electrical connection between the EON pin 32 and the electrical via 34. For example, because the arms 64 remain within the working range thereof, the arms 64 and 66 are capable of exerting a sufficient spring force on the electrically conductive material 42 that establishes a reliable electrical connection between the arms 64 and 66 and the material 42. Accordingly, the paths 104a and 104b plowed by the respective broaches 82a and 82b may enable relatively small electrical vias 34 (e.g., having diameters less than approximately 0.75 mm) to receive EON pins 32 therein without reducing the allowable tolerances of the diameters of the electrical vias 34, which for example may reduce the cost of manufacturing printed circuits and/or may reduce the number of printed circuits that can be manufactured within a given amount of time.

Although in the exemplary embodiment two paths 104a and 104b are plowed through the electrically conductive material 42, it should be understood that in some alternative embodiments, only one path 104a or 104b is plowed through the electrically conductive material. For example, in some circumstances, the depth of a single path is selected to be sufficient to provide the electrical via 34 with a width between the locations where the arms 64 and 66 engage the electrically conductive material 42 that is capable of accommodating the width W of the compliant segment 60 without compressing the arms 64 and 66 beyond the working range thereof. Accordingly, in some alternative embodiments, the tip segment 62 of the EON pin 32 includes only the broach 82a or the broach 82b such that the tip segment 62 plows only a single path through the electrically conductive material 42.

Various parameters of the EON pin 32, the compliant segment 60, the tip segment 62, the broach 82a, and/or the broach 82b may be selected to plow paths that provide the electrical via 34 with the width that is capable of receiving the width W of the compliant segment 60 without compressing the arms 64 and 66 beyond the working range thereof. For example, the size of the protrusions 84a and/or 84b, the shape of the protrusions 84a and/or 84b, the radius defining the curve of the broach tip 88 and/or 94, the size and/or shape of the broach tip 88 and/or 94 (FIG. 5), the distance $D_1$ (FIG. 5), the distance $D_2$ (FIG. 5), the relationship between the distance D (FIG. 5) and the distance $D_2$, the relationship between the distance D and the distance $D_1$, the width $W_1$ (FIG. 5), the relationship between the width W and the width $W_1$, and/or the like may be selected to provide the electrical via 34 with the width that is capable of receiving the width W of the compliant segment 60 without compressing the arms 64 and 66 beyond the working range thereof.

As described above, optionally each broach 82a and 82b has a size (e.g., the respective distances $D_1$ and $D_2$) that only plows the respective path 104a and 104b through the electrically conductive material 42 of the electrical via 34 when the diameter $D_4$ of the electrical via 34 is at a low end of the tolerance range of the diameter $D_4$. In such embodiments, the size of each broach 82a and 82b is provided such that each broach 82a and 82b does not plow the respective path 104a and 104b through the electrically conductive material 42 of the electrical via 34 when the tolerance of the diameter $D_4$ of the electrical via 34 is higher than the low end of the tolerance range. For example, for an electrical via 34 having a diameter $D_4$ of approximately 0.35 mm, the tolerance range may be +/−2 mils. The low end of such a tolerance range may be selected, for example, as between approximately 0 mils and approximately −2 mils. In such an example, the broaches 82a and 82b are sized such that the broaches 82a and 82b plow the respective paths 104a and 104b through the electrically conductive material 42 when the tolerance of the diameter $D_4$ of the electrical via 34 is less than approximately 0 mils. Moreover, in such an example, the broaches 82 and 82b are sized such that the broaches 82a and 82b do not plow the respective paths 104a and 104b through the electrically conductive material 42 when the tolerance of the diameter $D_4$ is equal to or greater than approximately 0 mils. As should be understood from the above description, the depths $D_5$ and $D_6$ of the paths 104a and 104b, respectively, will become smaller as the tolerance gets closer to the upper boundary (e.g., approximately 0 mils in the above example) of the low end of the tolerance range.

The diameter $D_4$, the tolerance range, and the upper boundary of the low end of the tolerance range are not limited to the exemplary values described above. Rather, the diameter $D_4$, the tolerance range, and the upper boundary of the low end of the tolerance range may each be provided with any other values or ranges thereof. For an electrical via 34 having a given diameter $D_4$, the size of the broaches and the upper boundary of the low end of the tolerance range may be selected such that the broaches 82a and 82b only plow the paths 104a and 104b when the tolerance of the diameter $D_4$ has a value that would cause the arms 64 and 66 to be compressed beyond the working range thereof. It should be understood that the embodiments (described above) wherein each broach 82a and 82b is only configured to plow the respective path 104a and 104b when the diameter $D_4$ of the electrical via 34 is at a low end of the tolerance range are applicable to embodiments having only a single broach 82. Specifically, the single broach of an EON pin 32 that only includes one broach 82 is optionally sized to plow the path through the electrically conductive material 42 of the electrical via 34 when the diameter $D_4$ of the electrical via 34 is at a low end of the tolerance range.

Figure 8A:
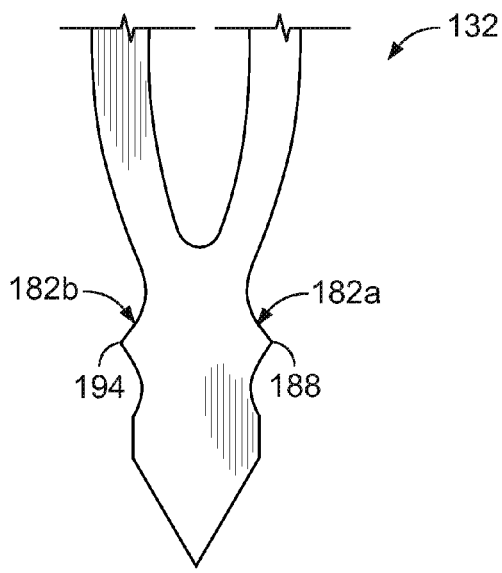
FIGS. 8A-8D illustrate examples of various alternative embodiments of EON pins.
Figure 8B:
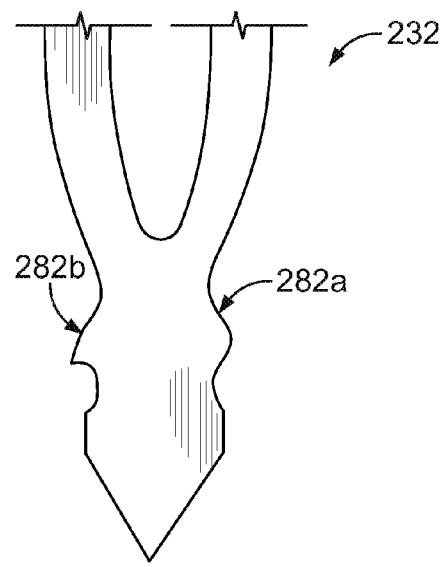
Figure 8C:
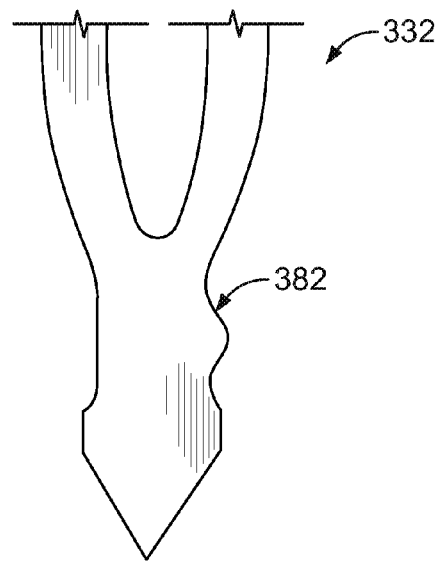
Figure 8D:
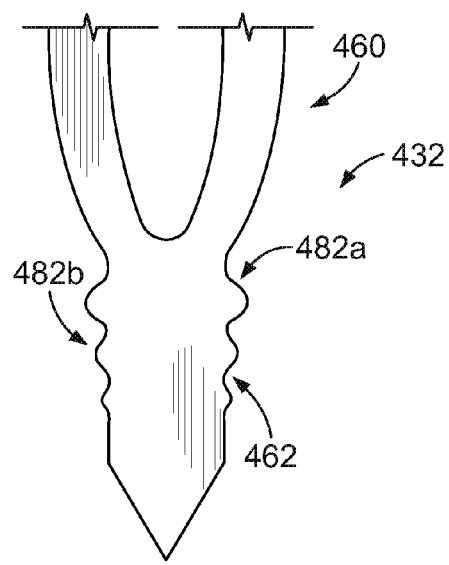

The broaches 82a and 82b are not limited to the geometries described and illustrated herein. Rather, each broach 82 may have any geometry that enables the broach 82 to plow any sized and/or shaped path through electrically conductive material for reception of an arm of an EON pin. For example, FIGS. 8A-8D illustrate various alternative embodiments of broach geometries. Specifically, FIG. 8A illustrates an EON pin 132 that includes broaches 182a and 182b having pointed tips 188 and 194, respectively. FIG. 8B illustrates an EON pin 232 having a broach 282a that has a different geometry than another broach 282b of the EON pin 232. FIG. 8C illustrates an EON pin 332 having only a single broach 382 for plowing a single path. FIG. 8D illustrates an EON pin 432 having two sequences of broaches 482a and 482b that grow progressively larger as a tip segment 462 of the EON pin 432 extends toward a compliant segment 460 of the EON pin 432. The sequence of broaches 482 progressively increases the depth of the path plowed thereby as the tip segment 462 is received into the electrical via 34 (FIGS. 1, 6, and 7).

As used herein, the term "printed circuit" is intended to mean any electric circuit in which the conducting connections have been printed or otherwise deposited in predetermined patterns on an electrically insulating substrate. The substrate 36 of the printed circuit 12 may be a flexible substrate or a rigid substrate. The substrate 36 may be fabricated from and/or include any material(s), such as, but not limited to, ceramic, epoxy-glass, polyimide (such as, but not limited to, Kapton® and/or the like), organic material, plastic, polymer, and/or the like. In some embodiments, the substrate 36 is a rigid substrate fabricated from epoxy-glass, such that the printed circuit 12 is what is sometimes referred to as a "circuit board" or a "printed circuit board".

It is to be understood that the above description is intended to be illustrative, and not restrictive. For example, the above-described embodiments (and/or aspects thereof) may be used in combination with each other. In addition, many modifications may be made to adapt a particular situation or material to the teachings of the subject matter described and/or illustrated herein without departing from its scope. Dimensions, types of materials, orientations of the various components, and the number and positions of the various components described and/or illustrated herein are intended to define parameters of certain embodiments, and are by no means limiting and are merely exemplary embodiments. Many other embodiments and modifications within the spirit and scope of the claims will be apparent to those of skill in the art upon reviewing the above description and the drawings. The scope of the subject matter described and/or illustrated herein should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

What is claimed is:

1. An eye-of-the needle (EON) pin contact for being received within an electrical via that includes conductive material, the EON pin contact comprising:
   a compliant segment comprising two opposing spring arms and an opening defined between the spring arms, the compliant segment being configured to be received within the electrical via such that the spring arms engage the conductive material of the electrical via; and
   a tip segment extending from the compliant segment, the tip segment being configured to be received into the electrical via before the compliant segment is received into the electrical via, the tip segment comprising a broach that is configured to displace the conductive material as the tip segment is received into the electrical via to plow a path through the conductive material for reception of a corresponding one of the spring arms.

2. The EON pin of claim 1, wherein the spring arms are first and second spring arms and the path is a first path for reception of the first spring arm, the broach being configured to displace the conductive material of the electrical via to plow a second path through the conductive material for reception of the second spring arm.

3. The EON pin of claim 1, wherein the tip segment comprises opposite front and rear walls and opposite side walls that extend between the front and rear walls, the broach comprising a protrusion that extends outward on one of the side walls.

4. The EON pin contact of claim 1, wherein the tip segment comprises opposite front and rear walls and opposite first and second side walls that extend between the front and rear walls, the broach comprising first and second protrusions that extend outward on the first and second side walls, respectively.

5. The EON pin contact of claim 1, wherein the electrical via extends a depth along a depth axis, the broach being configured to plow the path by displacing the conductive material at least one of along the depth axis or radially outward relative to the depth axis.

6. The EON pin contact of claim 1, wherein the compliant segment is configured to be compressed as the compliant segment is received into the electrical via such that the spring arms are moved towards each other, the path plowed by the broach being configured prevent over compression of the compliant segment.

7. The EON pin contact of claim 1, wherein the broach is configured to engage the conductive material of the electrical via with an interference fit to displace the conductive material.

8. The EON pin contact of claim 1, wherein the EON pin contact extends a length along a central longitudinal axis, the spring arms of the compliant segment comprising apexes where the springs arms engage the conductive material of the electrical via, the broach comprising an apex where the broach engages the conductive material, wherein the apex of the broach is spaced closer to the central longitudinal axis than the apex of the corresponding spring arm.

9. The EON pin contact of claim 1, further comprising opposite front and rear walls and opposite side walls that extend between the front and rear walls, the side walls comprising apexes where the spring arms engage the conductive material of the electrical via, at least one of the side walls comprising the broach.

10. The EON pin contact of claim 1, wherein the electrical via extends a depth along a depth axis, the path plowed by the broach extending approximately parallel to the depth axis of the electrical via.

11. The EON pin of claim 1, wherein the spring arms are coplanar.

12. A circuit board assembly comprising:
a circuit board having an electrical via that includes conductive material; and
an eye-of-the needle (EON) pin contact configured to be received within the electrical via, the EON pin contact comprising:
a compliant segment comprising two opposing arms and an opening defined between the arms; and
a tip segment extending from the compliant segment, the tip segment being configured to be received into the electrical via before the compliant segment is received into the electrical via, the tip segment comprising a protrusion that is configured to create an interference fit between the tip segment and the conductive material as the tip segment is received into the electrical via such that the protrusion displaces the conductive material and plows a path through the conductive material for reception of a corresponding one of the arms.

13. The circuit board assembly of claim 12, wherein the arms are first and second arms, the path is a first path for reception of the first arm, and the protrusion is a first protrusion, the tip segment further comprising a second protrusion that is configured to displace the conductive material of the electrical via to plow a second path through the conductive material for reception of the second arm.

14. The circuit board assembly of claim 12, wherein the tip segment comprises opposite front and rear walls and opposite side walls that extend between the front and rear walls, the protrusion extending outward on one of the side walls.

15. The circuit board assembly of claim 12, wherein the protrusion is a first protrusion, the tip segment comprising opposite front and rear walls and opposite first and second side walls that extend between the front and rear walls, the first protrusion extending outward on the first side wall, the tip segment further comprising a second protrusion that extends outward on the second side wall for plowing another path through the conductive material.

16. The circuit board assembly of claim 12, wherein the electrical via extends a depth along a depth axis, the protrusion being configured to plow the path by displacing the conductive material at least one of along the depth axis or radially outward relative to the depth axis.

17. The circuit board assembly of claim 12, further comprising opposite front and rear walls and opposite side walls that extend between the front and rear walls, the side walls comprising apexes where the arms engage the conductive material of the electrical via, at least one of the side walls comprising the protrusion.

18. The circuit board assembly of claim 12, wherein the electrical via extends a depth along a depth axis, the path plowed by the protrusion extending approximately parallel to the depth axis of the electrical via.

19. An eye-of-the needle (EON) pin contact for being received within an electrical via, the EON pin contact comprising:
a body extending along a central longitudinal axis, the body comprising:
a neck segment;
a compliant segment that extends from the neck segment, the compliant segment comprising two opposing spring arms and an opening defined between the spring arms; and
a tip segment extending from the compliant segment such that the compliant segment extends along the central longitudinal axis from the neck segment to the tip segment, the tip segment comprising opposite front and rear walls and opposite side walls that extend between the front and rear walls, the tip segment further comprising a protrusion that extends outward on one of the side walls in a non-parallel direction relative to the central longitudinal axis, wherein the protrusion is configured to displace conductive material of the electrical via as the tip segment is received into the electrical via to plow a path through the conductive material for reception of a corresponding one of the spring arms.

20. The EON pin contact of claim 19, wherein the side walls are first and second side walls and the protrusion is a first protrusion that extends outward on the first side wall, the tip segment further comprising a second protrusion that extends outward on the second side wall in a non-parallel direction relative to the central longitudinal axis.

\* \* \* \* \*